United States Patent [19]

Lösch et al.

[11] Patent Number: 5,054,870
[45] Date of Patent: Oct. 8, 1991

[54] ELECTRO-OPTICAL MULTIPLE CONNECTION ARRANGEMENT

[75] Inventors: Kurt Lösch, Stuttgart; Matjaz Florjancic, Murr, both of Fed. Rep. of Germany

[73] Assignee: Alcatel N.V., Amsterdam, Netherlands

[21] Appl. No.: 504,550

[22] Filed: Apr. 3, 1990

[30] Foreign Application Priority Data

Apr. 3, 1989 [DE] Fed. Rep. of Germany ....... 3910710

[51] Int. Cl.$^5$ ................................................ G02B 6/12
[52] U.S. Cl. .................................. 385/14; 250/227.24; 385/53
[58] Field of Search ............... 350/96.20, 96.21, 96.22, 350/96.11; 357/49, 70, 75, 80; 174/52.4; 361/397, 398, 421; 250/227.24, 551

[56] References Cited

U.S. PATENT DOCUMENTS

| | | | |
|---|---|---|---|
| 4,597,631 | 7/1986 | Flores | 350/96.20 |
| 4,611,886 | 9/1986 | Cline et al. | 350/96.20 |
| 4,695,120 | 9/1987 | Holder | 350/96.11 |
| 4,732,446 | 3/1988 | Gipson et al. | 350/96.15 |
| 4,871,224 | 10/1989 | Karstensen et al. | 350/96.15 |

OTHER PUBLICATIONS

Feil et al., "Hybridintegration, Technologie und Entwurf von Dickschichtschaltungen," Dr. Alfred Hüthig Verlag, Heidelberg, 1986.
Müller, Prof. Helmut, "Hochtechnologie-Multilayer," Eugen G. Leuze Verlag, 1988.

Primary Examiner—Frank Gonzalez
Attorney, Agent, or Firm—Christie, Parker & Hale

[57] ABSTRACT

For the connection of an electro-optical chip (5) to a substrate (4), optical and electrical connecting elements (1, 8) are produced on a flexible interconnect member (2) and connected, using a film bonding process previously known only for purely electrical connections, both with connector elements of the chip and with connector paths or optical waveguides (3) on the substrate. If the optical connecting elements (1) are positioned physically between the electrical connecting elements (8), they are secured and located by the soldering connections produced on both sides of the electrical connecting elements. In addition to electrical test adapter connectors, optical test loops which link optical inputs and outputs with each other and which are removed during a later stamping process can also be provided on the flexible interconnect member (2).

12 Claims, 2 Drawing Sheets

ELECTRO-OPTICAL MULTIPLE CONNECTION ARRANGEMENT

TECHNICAL FIELD

The invention concerns a multiple connection arrangement for the connection of an electro-optical chip to a substrate.

CLAIM FOR PRIORITY

This application is based on and claims priority from an application first filed in Fed. Rep. Germany on 3 Apr. 1989 under serial number 39 10 710.8. To the extent such prior application may contain any additional information that might be of any assistance in the use and understanding of the invention claimed herein, it is hereby incorporated by reference.

BACKGROUND ART

In the technical book "Hybrid Integration," published in 1986 by Dr. Alfred Hüthig Verlag, Heidelberg, so-called Tape-Automated-Bonding (TAB) or film bonding is described in Section 8.3.3 on pages 219 ff. In this simultaneous bonding process, an integrated circuit is connected to a substrate by means of a flexible interconnect member. The flexible interconnect member is taken from a flexible circuit board, which is fabricated, for example, in the form of a conventional movie film and which consists of multiple layers of polyimide film. The flexible circuit board may be populated on one or both sides. The conductor paths necessary for connection are produced on the circuit board using known processes.

To make the connection arrangement, the integrated circuit is first placed inside an opening stamped out of the circuit board into which a portion of the conductor paths produced on the circuit board protrude freely. Then, the [protruding free ends of the] conductor paths are simultaneously connected to suitable connector elements of the integrated circuit.

This first bonding step, the so-called inner-lead-bond (ILB), is followed by a second bonding step, the connection of the interconnect member with the substrate which contains the circuitry in which the integrated circuit is to operate.

In this second bonding step, the so-called outer-lead-bond (OLB), the integrated circuit is stamped out of the flexible circuit board along with the surrounding part of the flexible circuit board which forms the flexible interconnect member, and the conductor paths of the interconnect member thus produced and provided for connection with the substrate are simultaneously soldered to the conductor paths of the substrate.

One advantage of the two-step bonding is, among other things, the possibility of subjecting the integrated circuits mounted on the flexible circuit board to various tests following the first bonding step and thus being able to eliminate defective specimens. The connections required for these tests can be produced on the flexible circuit board along with the conductor paths provided for the multiple connection arrangement. After the second bonding step, they are left behind on the part of the flexible [flexible] circuit board no longer needed.

Recently, there has been increasing discussion and development of integrated circuits which include optical functions in addition to electrical functions and which must be linked with optical waveguides for this purpose.

In the technical book "High Technology Multilayers" by H. Müller, published by Eugen G. Leuze Verlag, 7968 Saulgau, various connection techniques currently possible for optical waveguides are discussed in Chapter 5.7 (pp. 273 ff.). In addition to discretely installed fibers, optical strip waveguides produced using photolithographic techniques are discussed. From this reference, the connection of optical strip waveguides to integrated circuits would appear to be too expensive for extensive application because of the requirements for accuracy.

DISCLOSURE OF INVENTION

The object of the invention is to enable a simple, easily producible connection of integrated circuits containing optical elements to the circuit substrates on which they are mounted.

Through the arrangement of optical waveguides on a flexible interconnect member, expensive, individually produced optical connections are replaced by a simultaneous connection technique, which, because of its similarity to the prior art automated film bonding (TAB) described above for electrical connections, offers the capability of producing optical and electrical connections automatically using a single process and the same equipment.

The placing of electrical and optical leads on the same interconnect member should be particularly advantageous with regard to the connection of components with both optical and electrical functions. The optical leads are placed or produced in the interstices between electrical leads (circuit board "traces"). There, they do not affect the electrical insulation of the electrical leads from each other and are inherently positioned and secured mechanically by the solder connections associated with the adjacent electrical leads. Because of this inherent mechanical positioning, special adjustment of the optical leads is no longer necessary. If the number of electrical leads required is small compared to that of the optical leads, strip leads having no electrical function may be provided merely to secure the optical leads. According to claim 3, instead of being secured using metal strip elements, the optical waveguides may also be secured to the flexible interconnect member by adhesive or embedded in a layer of optical sealing compound.

According to one specific embodiment, instead of optical fiber waveguides, optical strip waveguides produced using photolithographic techniques may also serve as leads.

In another specific embodiment there is the possibility of arranging optical functional elements, which would otherwise occupy precious surface space on the semiconductor of the integrated circuit, on the interconnect member.

In yet another specific embodiment the flexible interconnect member is a stamped part whose leads and optical functional elements are connected before the interconnect member is stamped out of a larger flexible circuit board (which may, for example, be produced in the same form as movie film) with optical and electrical leads located on this flexible circuit board to permit the connection of test adapters and the performance of tests. Thus, for example, it is possible to test the operation of optical elements by connecting optical inputs with optical outputs through optical guide structures located on the flexible circuit board.

BRIEF DESCRIPTION OF DRAWINGS

Using three figures, one embodiment of the multiple connection arrangement according to the invention is described in detail.

BEST MODE FOR CARRYING OUT THE INVENTION

Figure 1:
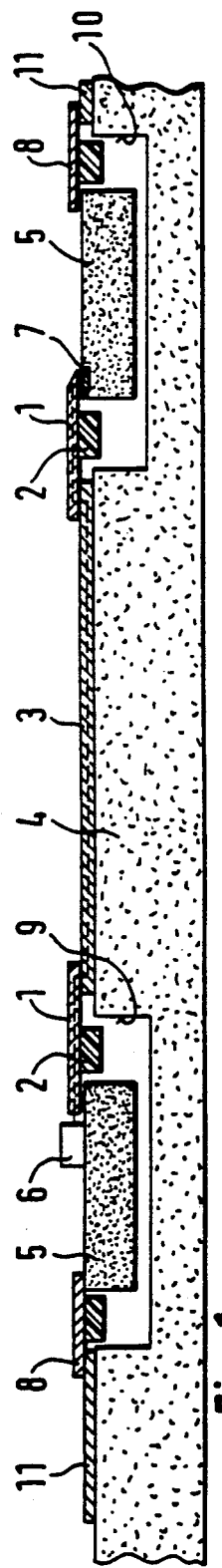
FIG. 1 shows schematically a cross-section through a substrate with a semiconductor chip with electrical and optical functions inserted.

FIG. 1 shows a substrate (circuit board) 4 which has indentations 9, 10 to accommodate semiconductor chips 5 which contain integrated circuits with electrically and optically active components. Rather than being rigidly connected to the substrate 4, the semiconductor chips are connected to it by electrical leads 8. Both the electrical leads (normally metallic circuit board traces) and optical leads 1 (glass fibers or photographically produced optical waveguides) are secured to a flexible polyimide support 2, which was stamped out of a larger flexible circuit board made of supporting material, before connection with either the chip or the substrate. In the stamping process, only the supporting material was cut so that both the electrical and optical leads previously produced on the flexible circuit board remain undamaged and protrude beyond the supporting material 2 on both sides.

As can be seen in FIG. 1, the electrical leads 8 are connected with conductor paths 11 of the substrate 4. The optical leads 1 constitute optical waveguides which are optically coupled with light sources 6 or receiving diodes 7 on the semiconductor chips and with optical waveguides 3 mounted on the substrate. No direct physical connection between the optical lead and either the semiconductor or the substrate is shown in FIG. 1. If necessary, this physical connection may be made by gluing or casting, or even by welding with thermoplastic waveguide material. The optical coupling is achieved through suitable preparation of the end surfaces of the optical leads and the substrate waveguide. Depending on the type of light source or light receptor, a perpendicular end surface (butt coupling) or a slanted and possibly mirror-coated end surface (FIG. 1) may be provided. Even more specialized end surface types are possible, such as spherical lenses, cylindrical lenses, or tapers.

Figure 2:
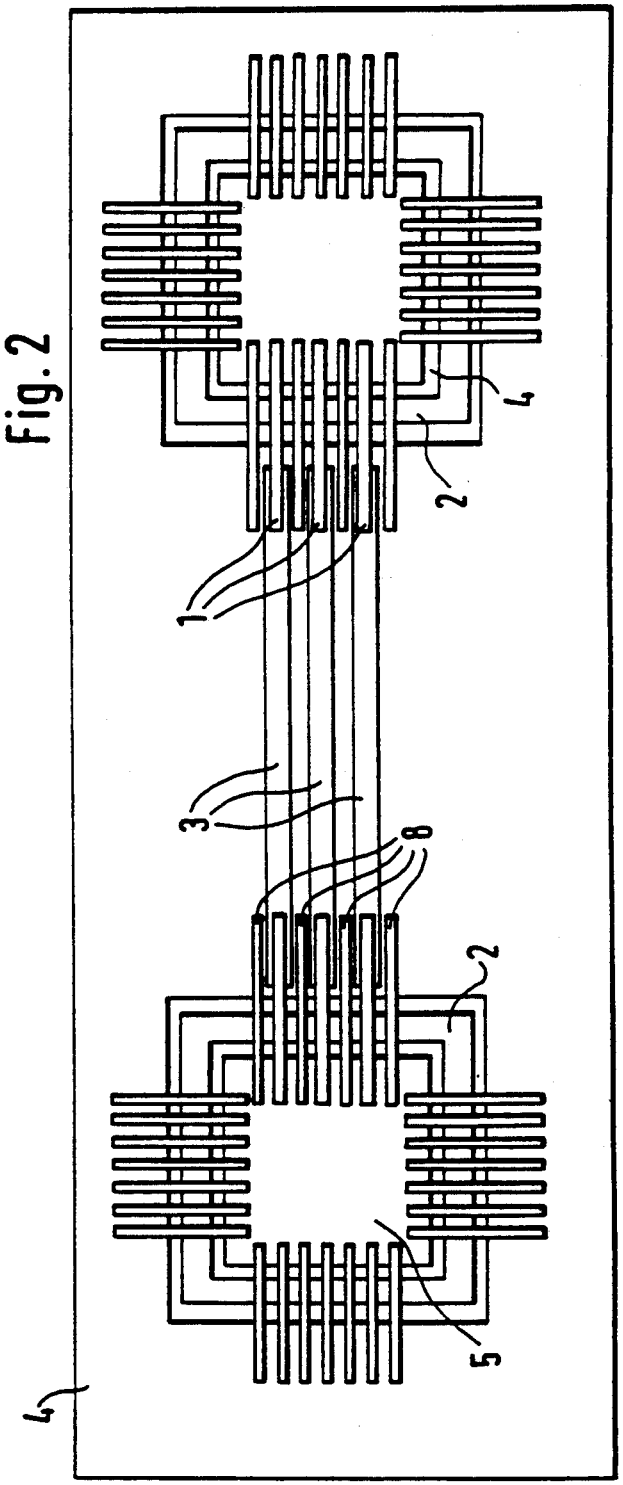
FIG. 2 shows a top view of a substrate with a semiconductor chip inserted.

FIG. 2 shows a top view of the arrangement of the optical leads 1 between electrical leads 8. In the process of attachment of the electrical lead located on both sides of the optical leads 1 to chip 5 and substrate 4—whose conductor paths are not shown in FIG. 2—the optical leads are secured in position and adjusted. The flexible interconnect member compensates for the differing coefficient of expansion of the substrate and the semiconductor so that mechanical stresses and temperature effects exert no negative influences on the connection.

Figure 3:
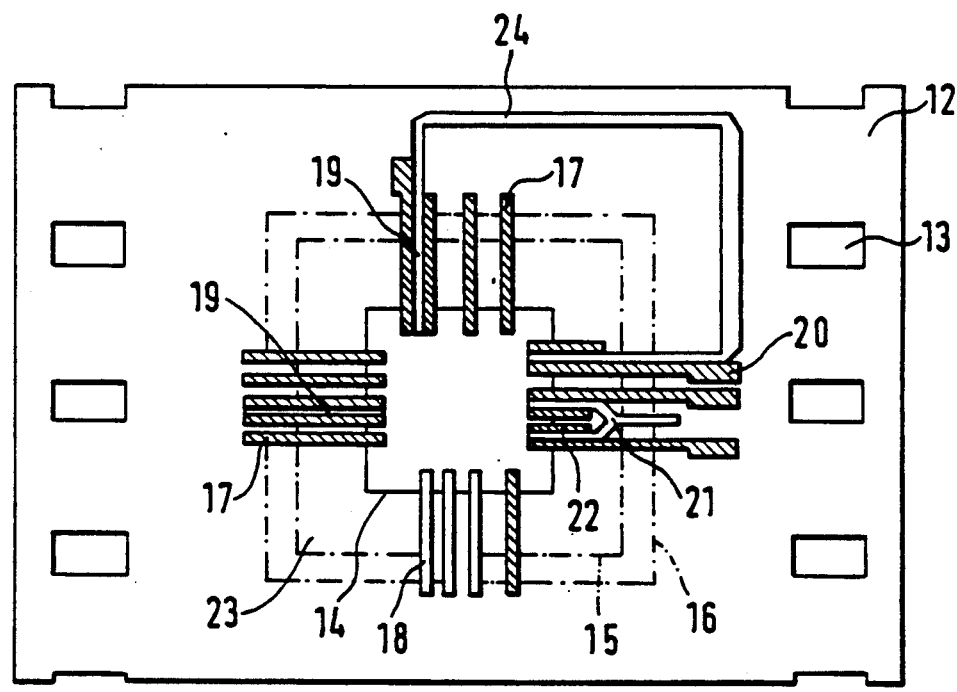
FIG. 3 shows a flexible interconnect member as part of a flexible circuit board before its connection to a semiconductor chip and a substrate.

The flexible interconnect member has a great many additional advantages which are demonstrated using FIG. 3:

FIG. 3 shows a flexible circuit board 12 which is made of a material suitable for the flexible interconnect member and which is provided with sprocket holes in the same manner as is movie film. Applied to the circuit board are electrical leads 17 and optical leads 18, 19, which protrude beyond the cut edges 14 of an opening stamped out from the back side of the circuit board, into which the semiconductor chip will later be inserted. Some of the electrical leads are provided with conductive pads 20 by which they can be connected to test adapters for testing purposes. They extend far beyond an external stamping line 16, along which the flexible interconnect member is later stamped from the flexible circuit board, into an outer region of the flexible circuit board, which is discarded as scrap following the stamping of the flexible interconnect member.

In this outer region of the flexible circuit board, there also extends an optical test loop 24, which connects two optical leads 19 to each other until the interconnect member with the semiconductor chip inserted is separated from the flexible circuit board. After stamping or etching along the stamping line 16, through an additional stamping procedure which is performed from the back side along a stamping line 15, the ends of the leads extending in the directions of the substrate remain free so that they can be connected to the conductor structure of the substrate without problems. Only the region 23 [of film 13] between stamping lines 14 and 15 where the leads are secured remains part of the interconnect member.

This region can be varied in its shape and size and provides space for the layout of connections of optical inputs and outputs such as splitters or delay lines, which then require no chip surface. A fanning out of densely positioned leads on the chip can also be effected on the interconnect member.

We claim:

1. Multiple connection arrangement for connecting a substrate to an integrated circuit comprising at least one optical component, the connection arrangement comprising:
   a flexible interconnect member between the integrated circuit and the substrate, and
   at least one optical waveguide extending across the flexible interconnect member and optically coupled to a corresponding said optical component.

2. A multiple connection arrangement as claimed in claim 1, further comprising
   a plurality of electrically conductive traces also extending across the flexible interconnect member,
   wherein said optical waveguide is positioned on and secured to the flexible interconnect member between two adjacent said electrical connecting traces.

3. A multiple connection arrangement as claimed in claim 1, wherein each said optical waveguide is secured to the flexible interconnect member.

4. A multiple connection arrangement as claimed in claim 1, wherein each said optical waveguide is formed on the flexible interconnect member using photolithographic techniques.

5. A multiple connection arrangement as claimed in claim 1, wherein the flexible interconnect member supports at least one optical functional element selected from the group consisting of splitters, directional couplers, and waveguide terminations.

6. Multiple connection arrangement as claimed in claim 5, wherein the flexible interconnect member is produced from a larger flexible circuit board supporting not only the electrical traces and said at least one optical functional element but also at least one temporary functional element selected from the group consisting of test-adapter connections and optical test loops which are adapted to be removed prior to the connection of the interconnection member to the substrate.

7. Multiple connection arrangement as claimed in claim 6, wherein said at least one temporary functional element is removed from said larger flexible circuit board by stamping.

8. Multiple connection arrangement as claimed in claim 6, wherein said at least one temporary functional element is removed from said larger flexible circuit board by etching.

9. Multiple connection arrangement as claimed in claim 3, wherein the optical waveguide is secured to the flexible interconnect by means of an adhesive.

10. Multiple connection arrangement as claimed in claim 3, wherein the optical waveguide is embedded in a layer of optical sealing compound between the flexible interconnect member and the waveguide.

11. Multiple connection arrangement as claimed in claim 6, wherein the flexible interconnect member is stamped out of the larger flexible circuit board.

12. Multiple connection arrangement as claimed in claim 6, wherein the boundary between the flexible interconnect member and the remainder of the larger flexible circuit board is defined during a subsequent etching operation.

* * * * *